(12) United States Patent
Jones et al.

(10) Patent No.: US 7,977,947 B1
(45) Date of Patent: Jul. 12, 2011

(54) LOW IMPEDANCE SERIES COUPLED RADIO FREQUENCY DIRECTIONAL POWER DETECTOR

(75) Inventors: David E. Jones, Cedar Rapids, IA (US); Derek Schooley, Oak Ridge, NC (US); Neal Mains, Marion, IA (US)

(73) Assignee: RF Micro Devices, Inc., Greensboro, NC (US)

( * ) Notice: Subject to any disclaimer, the term of this patent is extended or adjusted under 35 U.S.C. 154(b) by 353 days.

(21) Appl. No.: 11/774,972

(22) Filed: Jul. 9, 2007

Related U.S. Application Data

(60) Provisional application No. 60/825,471, filed on Sep. 13, 2006.

(51) Int. Cl.
*G01R 31/08* (2006.01)

(52) U.S. Cl. ............... 324/522; 455/115.1; 455/115.2; 455/115.3; 455/127.1; 455/127.2; 330/96; 330/298; 343/745

(58) Field of Classification Search .................. 324/522; 455/115.1, 115.3, 127.1, 127.2
See application file for complete search history.

(56) References Cited

U.S. PATENT DOCUMENTS

| | | | | |
|---|---|---|---|---|
| 4,011,529 A * | 3/1977 | Garcia | .......................... | 333/115 |
| 5,070,309 A * | 12/1991 | Swanson | ....................... | 330/298 |
| 5,206,600 A * | 4/1993 | Moehlmann | ................... | 324/650 |
| 5,381,137 A * | 1/1995 | Ghaem et al. | .............. | 340/572.5 |
| 5,483,680 A * | 1/1996 | Talbot | ........................... | 455/107 |
| 6,188,277 B1 * | 2/2001 | Borodulin et al. | .............. | 330/51 |
| 6,362,685 B1 * | 3/2002 | Vagher | ....................... | 330/124 R |
| 6,417,732 B1 * | 7/2002 | Radomski et al. | .......... | 330/207 P |
| 2004/0113686 A1 * | 6/2004 | Dupuis et al. | ................. | 330/140 |
| 2005/0059362 A1 * | 3/2005 | Kalajo et al. | ................ | 455/127.1 |
| 2006/0088655 A1 * | 4/2006 | Collins et al. | ..................... | 427/8 |
| 2006/0232471 A1 * | 10/2006 | Coumou | ....................... | 342/450 |

* cited by examiner

*Primary Examiner* — Timothy J Dole
*Assistant Examiner* — Benjamin M Baldridge
(74) *Attorney, Agent, or Firm* — Withrow & Terranova, P.L.L.C.

(57) ABSTRACT

The present invention is a low series impedance directional power detector, which may be used to measure either forward or reverse power in a radio frequency (RF) circuit. The directional power detector includes current detection circuitry to directionally measure current, voltage detection circuitry to measure voltage, and combining circuitry to combine the directional RF current measurements and the RF voltage measurements into a combined RF measurement, which is indicative of directional power. The current detection circuitry and voltage detection circuitry apply any phase-shifts that are needed to detect power in the direction of interest and ignore power in the opposite direction when the directional power detector is presented with a complex load.

25 Claims, 12 Drawing Sheets

LOW IMPEDANCE SERIES COUPLED RADIO FREQUENCY DIRECTIONAL POWER DETECTOR

This application claims the benefit of provisional patent application Ser. No. 60/825,471, filed Sep. 13, 2006, the disclosure of which is hereby incorporated by reference in its entirety.

FIELD OF THE INVENTION

The present invention relates to radio frequency (RF) directional power detectors used in RF communications circuitry, such as RF transmitters and RF receivers.

BACKGROUND OF THE INVENTION

The radiated output power of mobile terminals, such as mobile phones, Personal Digital Assistants (PDAs), and the like, is based on forward power provided to an antenna by a power amplifier. The forward power is a function of the total power delivered by the power amplifier minus any power reflected back from the antenna due to impedance mismatches from the power amplifier to the antenna. The relationship of forward power to reflected, or reverse, power may be characterized using a voltage standing wave ratio (VSWR). For an open loop power amplifier, the total delivered power is a function of the load impedance seen at the output of the power amplifier. Ideally, the load impedance is a constant load. However, in reality, the load impedance may vary due to variations in the impedance of the components in the transmit chain following the power amplifier, such as impedance matching circuitry or a duplexer, caused by frequency, temperature, and process variations. The load impedance may also vary due to variations in the impedance of the antenna of the mobile terminal caused by proximity of the antenna to foreign metallic objects and the user's body.

These impedance variations and resulting VSWR variations may reduce the delivered power from the power amplifier and may reflect a portion of the delivered power back to the power amplifier, thereby reducing the forward power fed into the antenna. Therefore, to maintain a relatively constant radiated power from the antenna, the forward power may be measured and then regulated by controlling the output power of the power amplifier. VSWR measurements may be made by measuring both the forward and reverse power.

Directional power detectors, also known as directional couplers, are used to measure forward or reverse power and are traditionally coupled between impedance matching circuitry and the antenna; however, a traditional directional coupler may introduce harmonics, which must be removed with harmonics filtering that is coupled between the directional coupler and the antenna. Coupling the directional coupler between the power amplifier and the impedance matching circuitry may eliminate the need for the harmonics filtering; however, a traditional directional coupler may present an unacceptably high impedance in series with the low output impedance of the power amplifier. Traditional directional couplers may have difficulty differentiating forward from reverse power when presented with a complex load impedance, such as that presented by impedance matching circuitry. Thus, there is a need for a low series impedance directional power detector that can accurately differentiate forward from reverse power when presented with a complex load impedance.

SUMMARY OF THE INVENTION

The present invention is a low series impedance directional power detector, which may be used to measure either forward or reverse power in an RF circuit. The directional power detector includes current detection circuitry to directionally measure current, voltage detection circuitry to measure voltage, and combining circuitry to combine the directional RF current measurements and the RF voltage measurements into a combined RF measurement, which is indicative of directional power. The current detection circuitry and voltage detection circuitry apply any phase-shifts that are needed to detect power in the direction of interest and ignore power in the opposite direction when the directional power detector is presented with a complex load.

In one embodiment of the present invention, the combined RF measurement may be converted into a direct current (DC) voltage measurement. The directional power detector may be coupled between an output of a power amplifier and a complex load, which may include impedance matching circuitry or impedance translating circuitry. The directional power detector may be coupled closely to the transistors of the power amplifier output on a common semiconductor die. The directional power detector and the power amplifier may be provided by a single semiconductor die or by multiple semiconductor dies mounted to a common substrate. The impedance of the downstream load may be approximately resistive, or it may include reactance.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention is a low series impedance directional power detector, which may be used to measure either forward or reverse power in an RF circuit. The directional power detector includes current detection circuitry to directionally measure current, voltage detection circuitry to measure voltage, and combining circuitry to combine the directional RF current measurements and the RF voltage measurements into a combined RF measurement, which is indicative of directional power. The current detection circuitry and voltage detection circuitry apply any phase-shifts that are needed to detect power in the direction of interest and ignore power in the opposite direction when the directional power detector is presented with a complex load.

In one embodiment of the present invention, the combined RF measurement may be converted into a DC voltage measurement. The directional power detector may be coupled between an output of a power amplifier and a complex load, which may include impedance matching circuitry or impedance translating circuitry. The directional power detector may be coupled closely to the transistors of the power amplifier output on a common semiconductor die. The directional power detector and the power amplifier may be provided by a single semiconductor die or by multiple semiconductor dies mounted to a common substrate. The directional power detector may be located upstream of a downstream load. The impedance of the downstream load may be approximately resistive, or it may include reactance. Alternatively, the directional power detector may be located in any RF signal path to indicate forward power or reverse power. Multiple directional power detectors may be located in any RF signal path to indicate both forward and reverse power.

Figure 1:
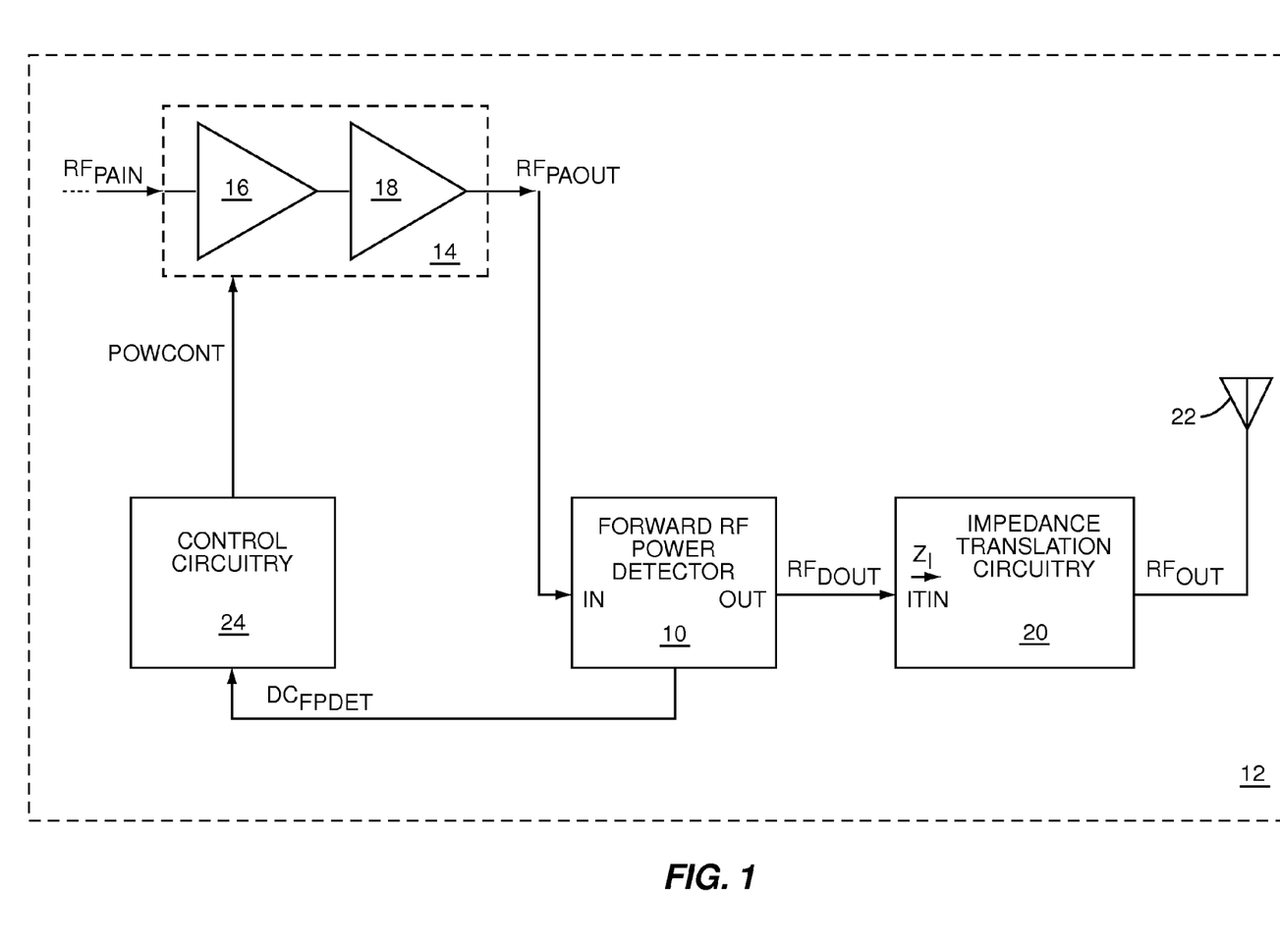
FIG. 1 shows a forward RF power detector used in an RF transmitter according to one embodiment of the present invention.

FIG. 1 shows a forward RF power detector 10 used in a partial RF transmitter circuit 12 according to one embodiment of the present invention. A power amplifier 14 receives an RF power amplifier input signal $RF_{PAIN}$ into a driver stage 16, which feeds a final stage 18. The driver and final stages 16, 18 amplify the RF power amplifier input signal $RF_{PAIN}$ to provide an RF power amplifier output signal $RF_{PAOUT}$ to an input IN of the forward RF power detector 10. An output OUT of the forward RF power detector 10 provides an RF detector output signal $RF_{DOUT}$ to an impedance translation input ITIN of impedance translation circuitry 20, which provides an RF output signal $RF_{OUT}$ to an antenna 22. The impedance translation circuitry 20 translates an impedance presented by the antenna 22 to an input impedance $Z_I$ presented at the impedance translation input ITIN. The input impedance $Z_I$ presents a closer impedance match to the output of the final stage 18 than the impedance presented by the antenna 22. The forward RF power detector 10 is suitable for the low impedances presented by the output of the final stage 18 and the impedance translation input ITIN. Since the impedance translation circuitry 20 is downstream of the forward RF power detector 10, harmonics filtering may not be necessary. The forward RF power detector 10 provides a DC forward power detection signal $DC_{FPDET}$ to control circuitry 24. The DC forward power detection signal $DC_{FPDET}$ is indicative of the forward power transferred from the final stage 18 to the impedance translation input ITIN, which may be used by the control circuitry 24 to adjust the power output of the power amplifier 14. The control circuitry 24 provides power control information to the power amplifier 14 by providing a power control signal POWCONT to the power amplifier 14.

Figure 2:
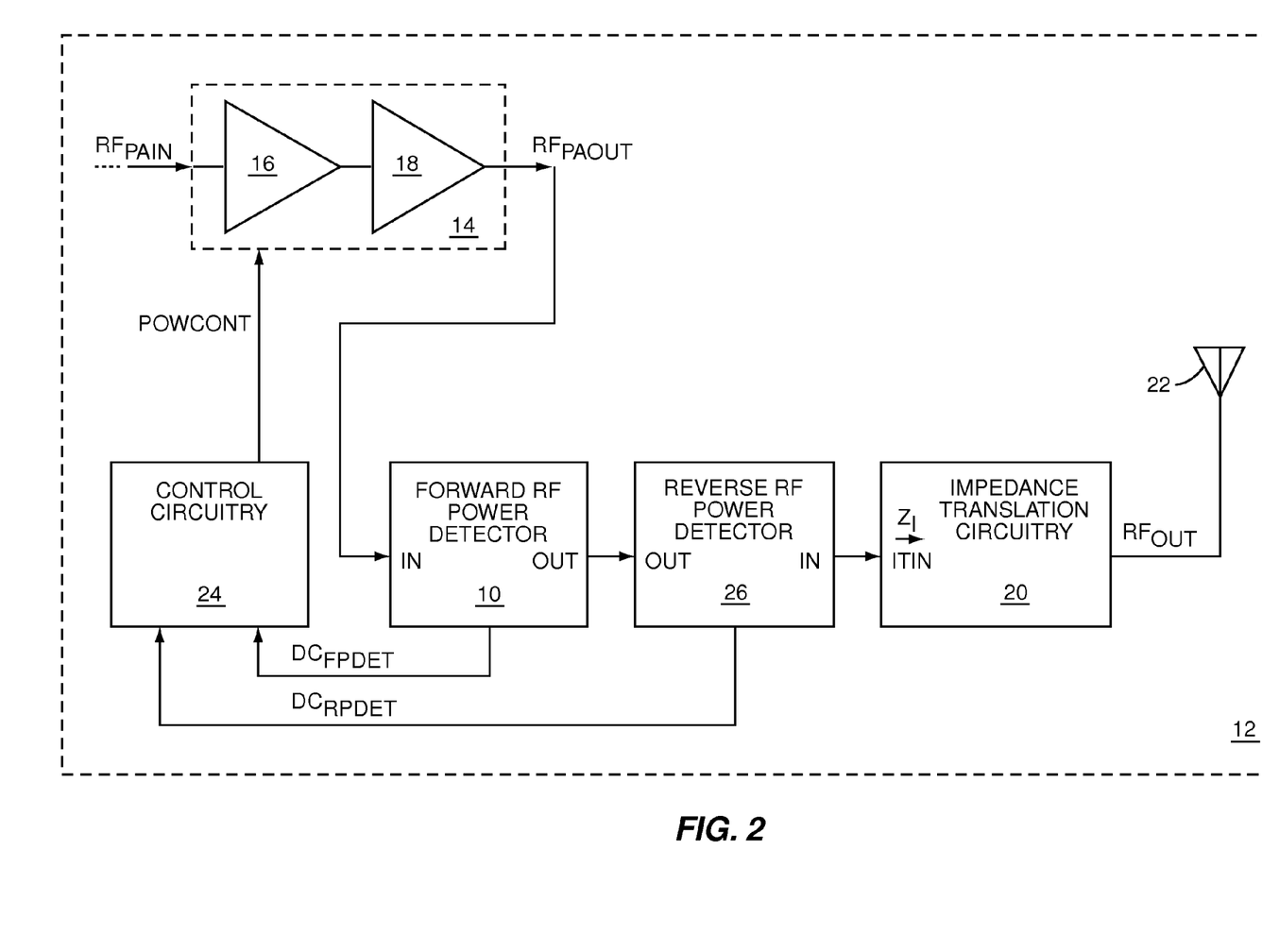
FIG. 2 adds a reverse RF power detector to the RF transmitter illustrated in FIG. 1.

FIG. 2 adds a reverse RF power detector 26 to the RF transmitter illustrated in FIG. 1. The reverse RF power detector 26 provides a DC reverse power detection signal $DC_{RPDET}$ to the control circuitry 24. The DC reverse power detection signal $DC_{RPDET}$ is indicative of the reverse power transferred from the impedance translation input ITIN to the output of the final stage 18. The control circuitry 24 can use the forward and reverse power information provided by the forward and reverse RF power detectors 10, 26 to determine a voltage standing wave ratio (VSWR).

Figure 3:
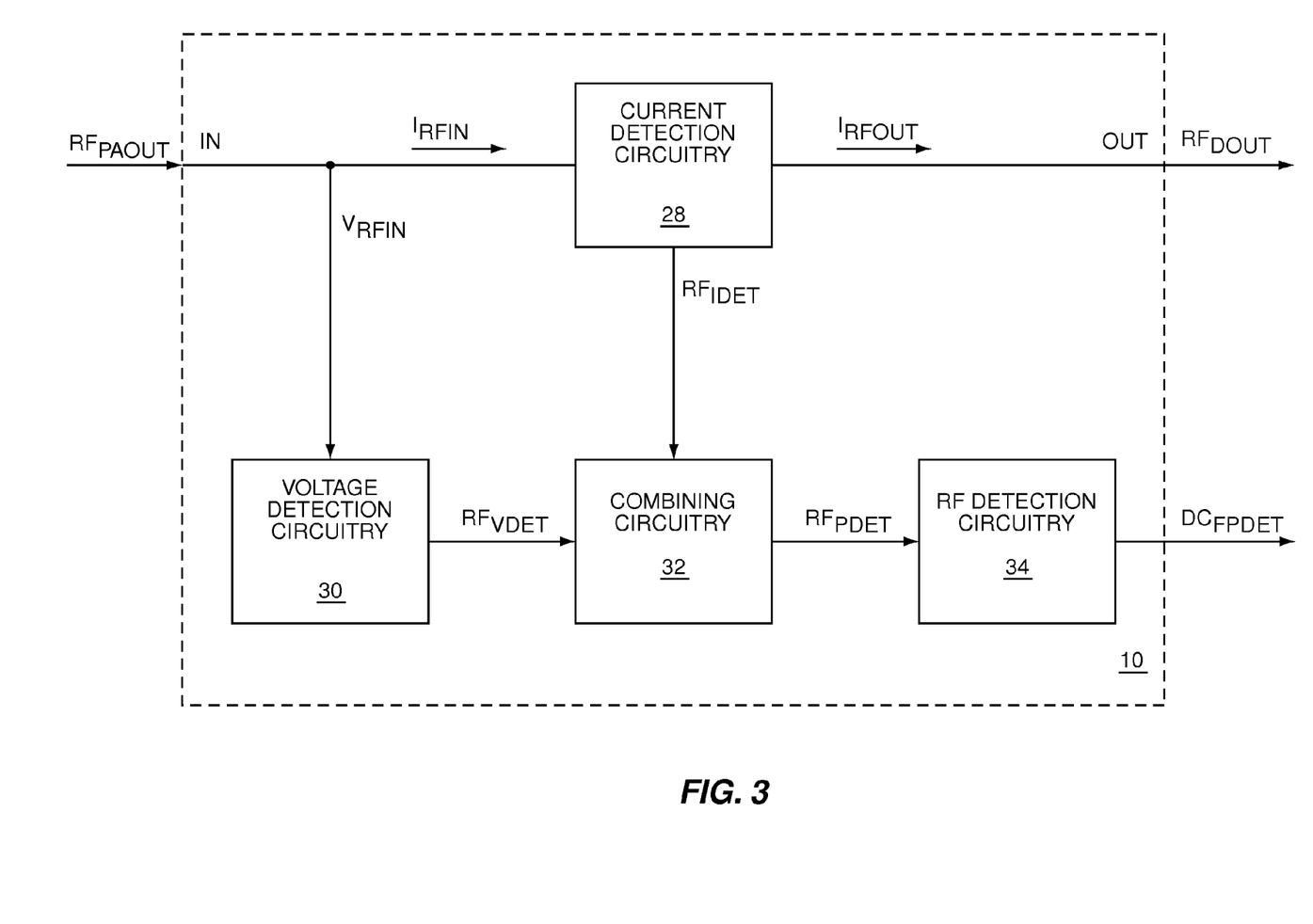
FIG. 3 shows details of the forward RF power detector illustrated in FIG. 1.

FIG. 3 shows details of the forward RF power detector 10 illustrated in FIG. 1. The RF power amplifier output signal $RF_{PAOUT}$ includes an RF input voltage $V_{RFIN}$ at the input IN and an RF input current $I_{RFIN}$ flowing into the input IN. The RF detector output signal $RF_{DOUT}$ includes an RF output voltage $V_{RFOUT}$ at the output OUT and an RF output current $I_{RFOUT}$ flowing out of the output OUT. Current detection circuitry 28 is coupled between the input IN and the output OUT. The current detection circuitry 28 provides an RF current detection signal $RF_{IDET}$, which is based on the RF input current $I_{RFIN}$, the RF output current $I_{RFOUT}$, or both. In one embodiment of the present invention, the RF input current $I_{RFIN}$ is approximately equal to the RF output current $I_{RFOUT}$. The voltage drop across the current detection circuitry 28 may be low enough to enable use of the forward RF power detector 10 in low impedance circuits such as outputs of power amplifiers.

Voltage detection circuitry 30 is coupled to the input IN and provides an RF voltage detection signal $RF_{VDET}$, which is based on the RF input voltage $V_{RFIN}$. The impedance of the voltage detection circuitry 30 is high enough to prevent significant loading of the input IN. Combining circuitry 32 combines the RF voltage detection signal $RF_{VDET}$ and the RF current detection signal $RF_{IDET}$ to provide an RF power detection signal $RF_{PDET}$ which is indicative of forward power. The phase relationship of the RF voltage detection signal $RF_{VDET}$ to the RF current detection signal $RF_{IDET}$ is such that detected voltage and detected current from forward power combine in an additive fashion, while detected voltage and detected current from reverse power combine to cancel each other. Therefore, the RF power detection signal $RF_{PDET}$ is indicative of forward power only. RF detection circuitry 34 converts the RF power detection signal $RF_{PDET}$ from an RF signal into a DC signal to provide the DC forward power detection signal $DC_{FPDET}$.

Figure 4:
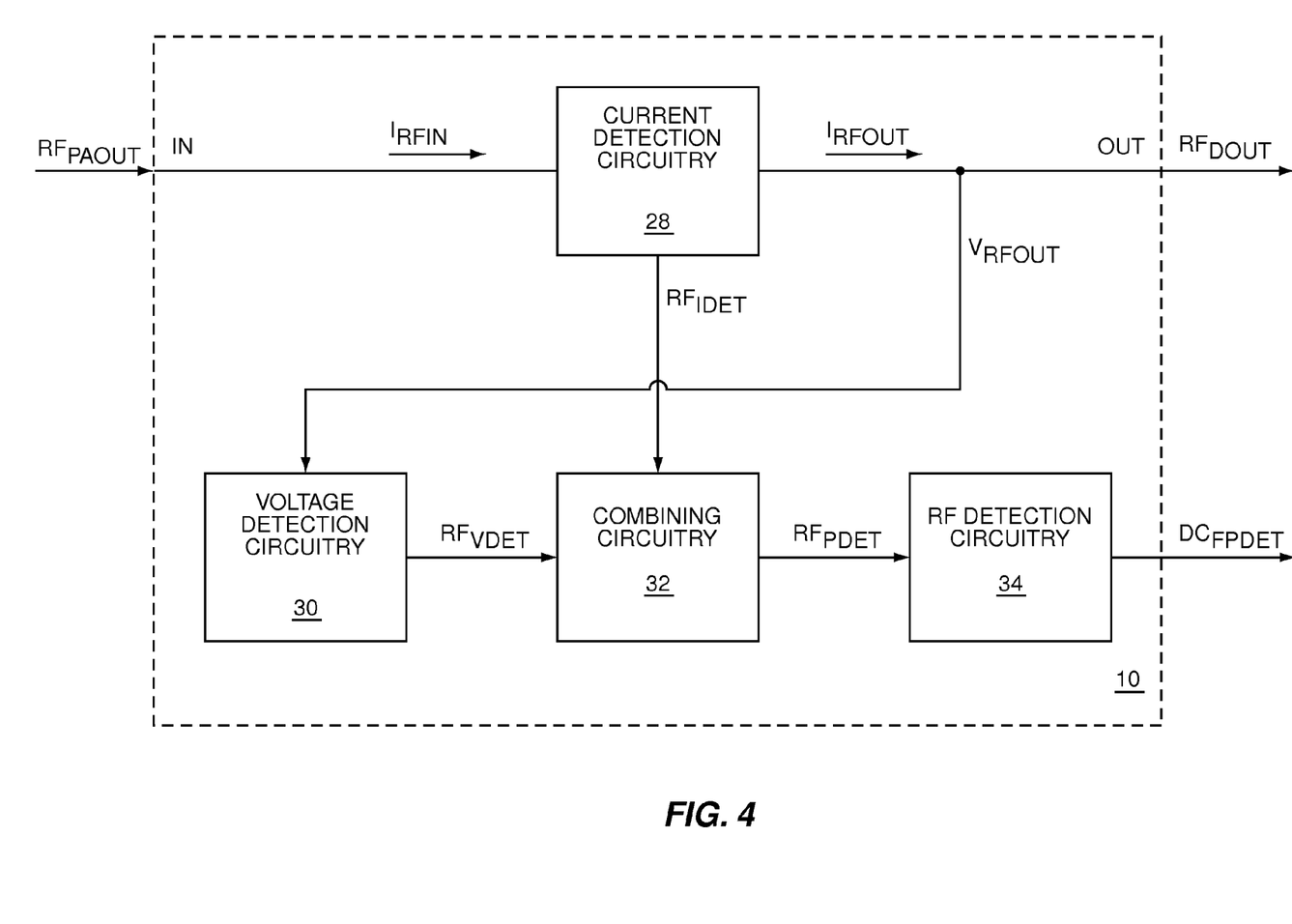
FIG. 4 shows an alternate embodiment of the forward RF power detector illustrated in FIG. 1.

FIG. 4 shows an alternate embodiment of the forward RF power detector 10 illustrated in FIG. 1. The voltage detection circuitry 30 is coupled to the output OUT instead of the input IN as illustrated in FIG. 3.

Figure 5:
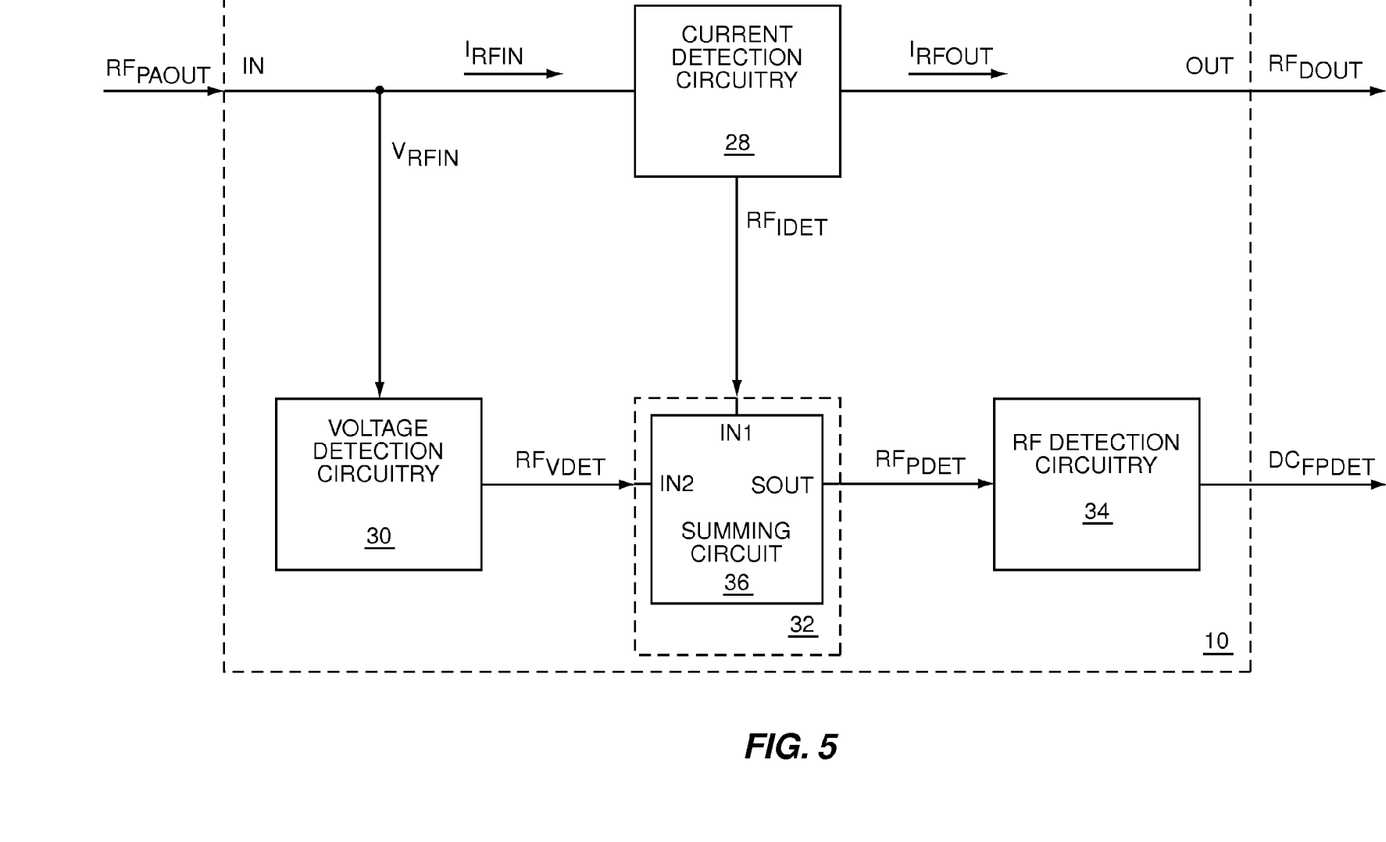
FIG. 5 shows a first embodiment of the combining circuitry illustrated in FIG. 3.

FIG. 5 shows a first embodiment of the combining circuitry 32 illustrated in FIG. 3. The combining circuitry 32 includes a summing circuit 36, which has a first input IN1 that receives the RF current detection signal $RF_{IDET}$, a second input IN2 that receives the RF voltage detection signal $RF_{VDET}$, and a summing output SOUT that provides the RF power detection signal $RF_{PDET}$, which is approximately equal to the sum of the RF current detection signal $RF_{IDET}$ and the RF voltage detection signal $RF_{VDET}$.

Figure 6:
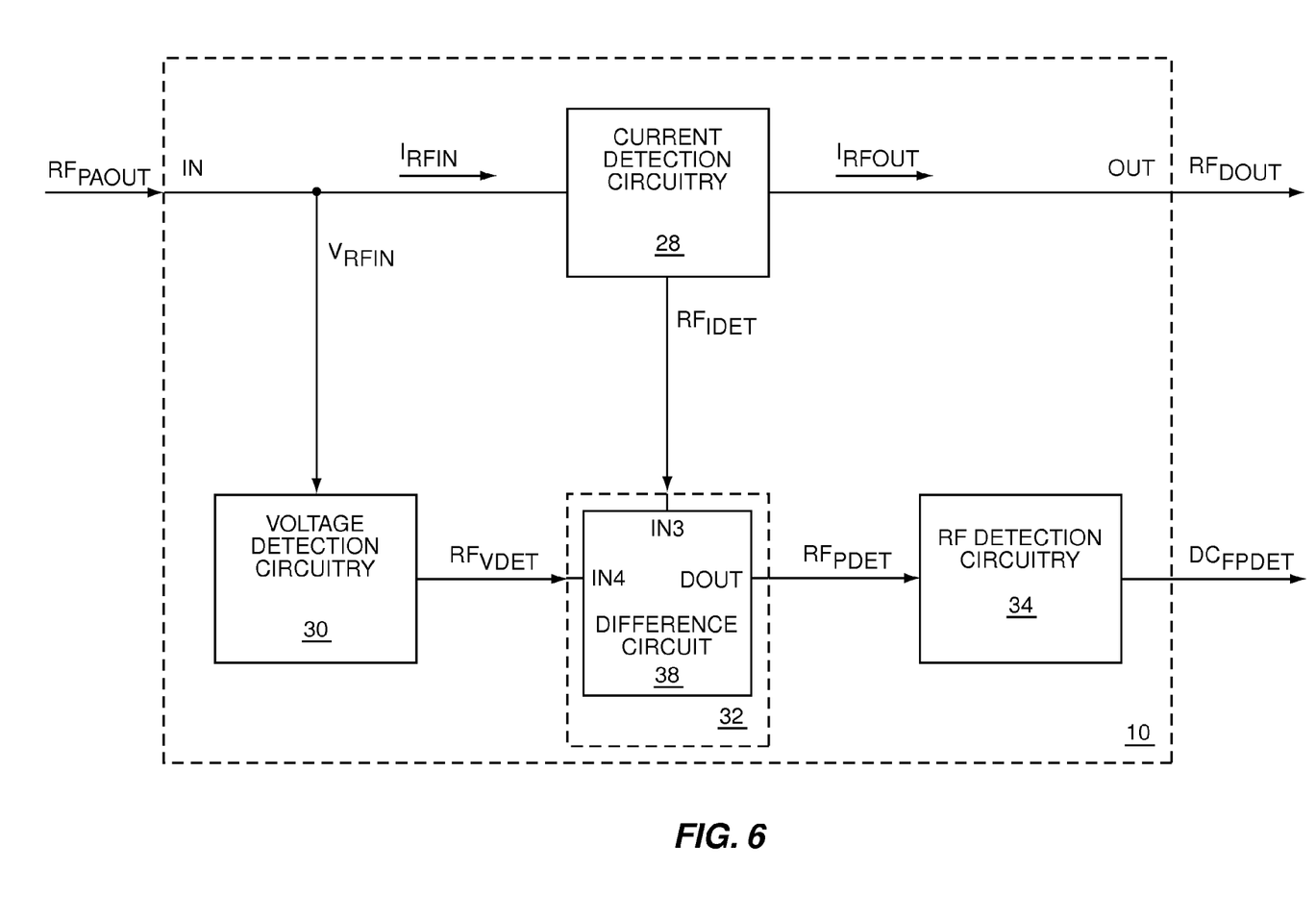
FIG. 6 shows a second embodiment of the combining circuitry illustrated in FIG. 3.

FIG. 6 shows a second embodiment of the combining circuitry 32 illustrated in FIG. 3. The combining circuitry 32 includes a difference circuit 38, which has a third input IN3 that receives the RF current detection signal $RF_{IDET}$, a fourth input IN4 that receives the RF voltage detection signal $RF_{VDET}$, and a difference output DOUT that provides the RF power detection signal RF$_{PDET}$, which is approximately equal to a difference between the RF current detection signal RF$_{IDET}$ and the RF voltage detection signal RF$_{VDET}$.

Figure 7:
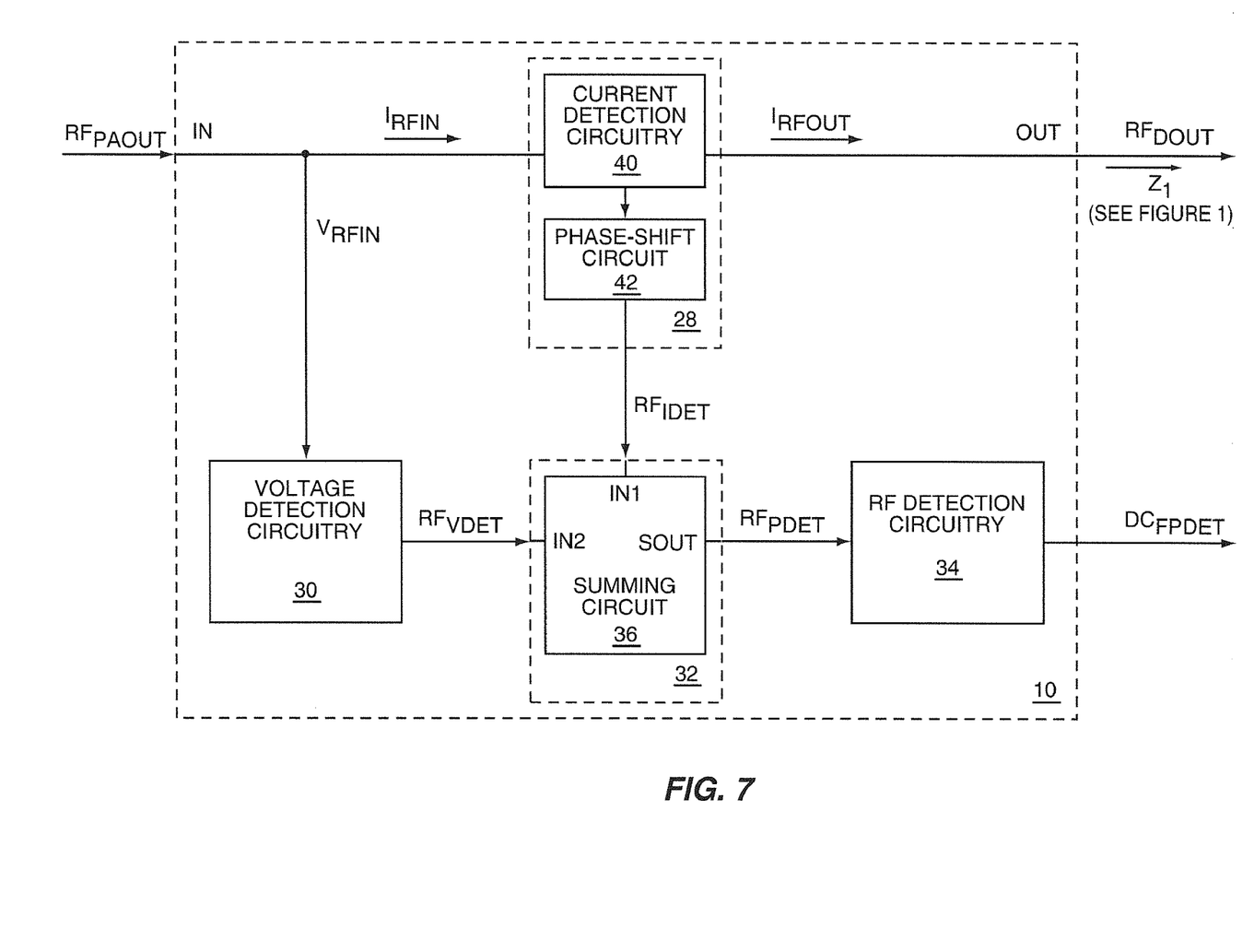
FIG. 7 adds a current detection circuit and a phase-shift circuit to the current detection circuitry illustrated in FIG. 5.

FIG. 7 adds a current detection circuit 40 and a phase-shift circuit 42 to the current detection circuitry 28 illustrated in FIG. 5. The current detection circuit 40 provides a current detection signal that is based on the RF input current I$_{RFIN}$, the RF output current I$_{RFOUT}$, or both, to the phase-shift circuit 42, which applies a phase-shift to provide the RF current detection signal RF$_{IDET}$. In one embodiment of the present invention, the phase-shift provided by the phase-shift circuit 42 is approximately equal to the phase-shift provided by the input impedance Z$_I$.

Figure 8:
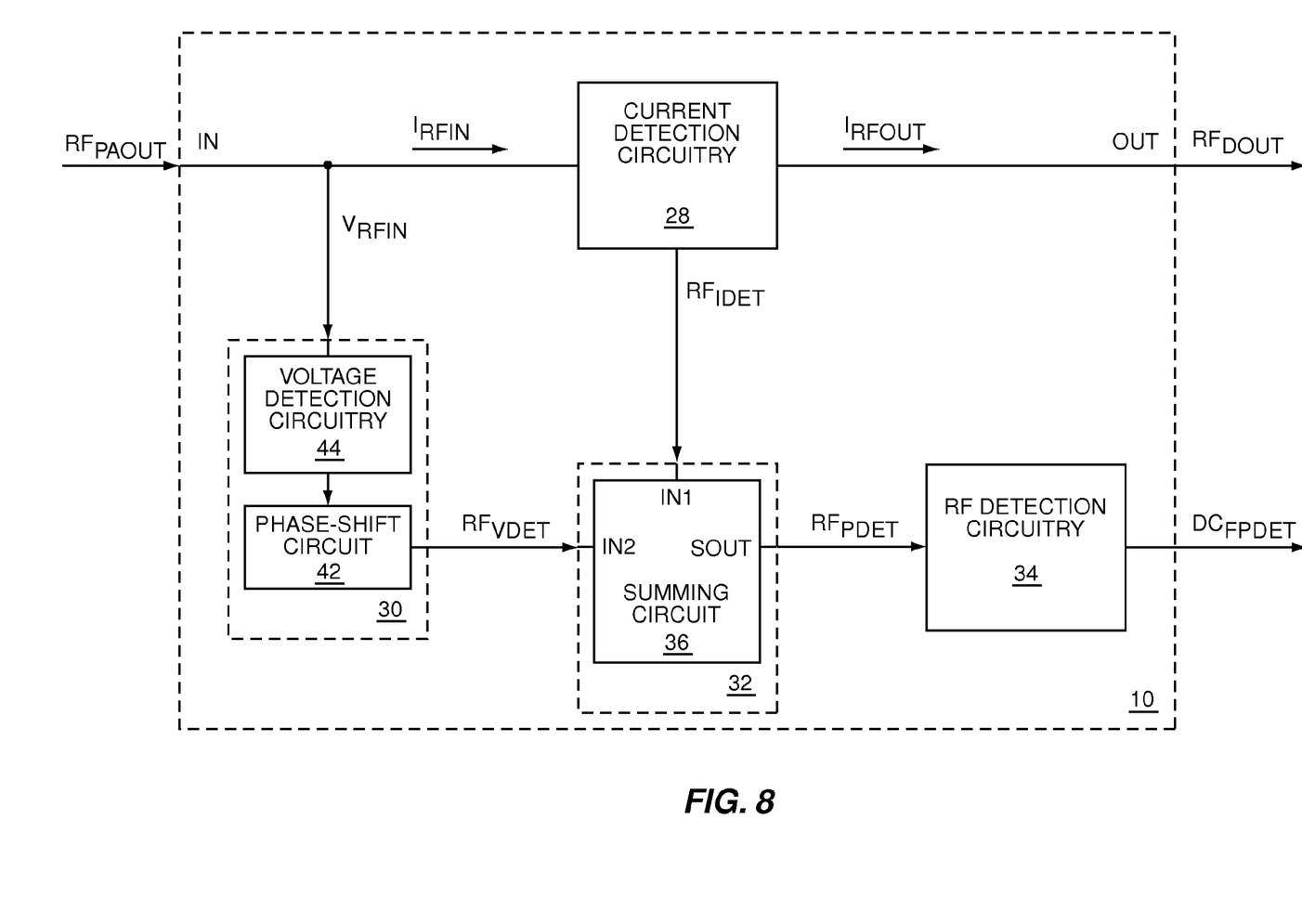
FIG. 8 adds a voltage detection circuit and the phase-shift circuit to the voltage detection circuitry illustrated in FIG. 5.

FIG. 8 adds a voltage detection circuit 44 and the phase-shift circuit 42 to the voltage detection circuitry 30 illustrated in FIG. 5. The voltage detection circuit 44 provides a voltage detection signal based on the RF input voltage V$_{RFIN}$ to the phase-shift circuit 42, which applies a phase-shift to create the RF voltage detection signal RF$_{VDET}$. In one embodiment of the present invention, the phase-shift provided by the phase-shift circuit 42 is approximately equal to the phase-shift provided by the input impedance Z$_I$.

Figure 9:
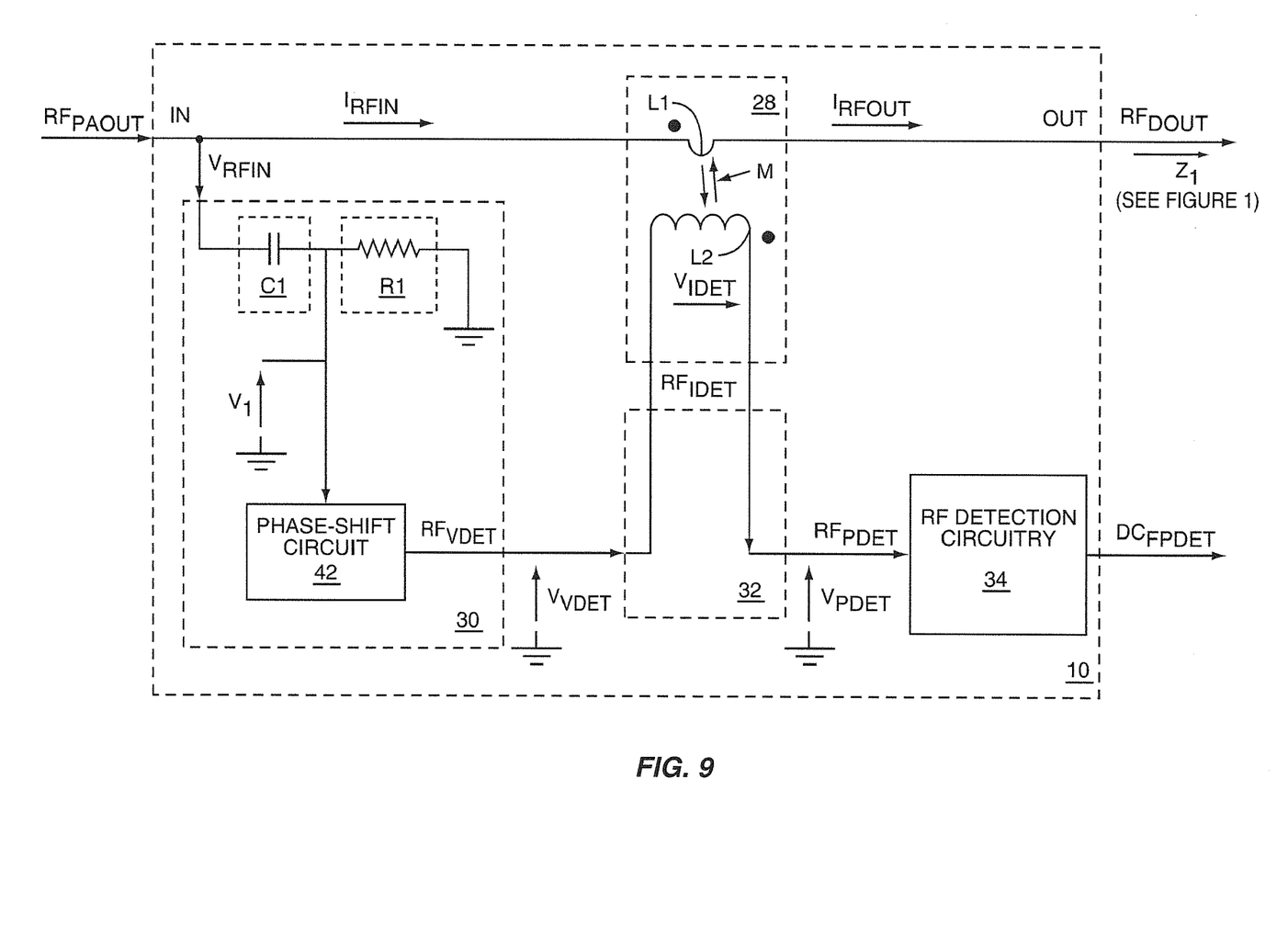
FIG. 9 shows details of the current detection circuitry, the voltage detection circuitry, and the combining circuitry illustrated in FIG. 8.

FIG. 9 shows details of the current detection circuitry 28, the voltage detection circuitry 30, and the combining circuitry 32 illustrated in FIG. 8. The current detection circuitry 28 includes a first inductive element L1, which is coupled between the input IN and the output OUT. The first inductive element L1 is magnetically coupled to a second inductive element L2, which provides the RF current detection signal RF$_{IDET}$. The first and second inductive elements L1, L2 are mutually coupled inductors having a mutual inductance M. An RF current detection voltage V$_{IDET}$ appears across the second inductive element L2. The voltage detection circuitry 30 includes the phase-shift circuit 42 and a first capacitive element C1 that is coupled between the input IN and the phase-shift circuit 42. A first resistive element R1 is coupled between the phase-shift circuit 42 and GROUND. A first voltage V$_1$ appears across the first resistive element R1. The combining circuitry 32 connects one end of the second inductive element L2 to the phase-shift circuit 42, and the other end of the second inductive element L2 to the RF detection circuitry 34. An RF voltage detection voltage V$_{VDET}$ appears between the output of the phase-shift circuit 42 and GROUND. An RF power detection voltage V$_{PDET}$ appears between the input to the RF detection circuitry 34 and GROUND. In one embodiment of the present invention, the phase-shift provided by the phase-shift circuit 42 is approximately equal to the phase-shift provided by the input impedance Z$_I$.

In an exemplary embodiment of the present invention, the phase-shift circuit 42 is used to compensate for any phase-shift presented by the input impedance Z$_I$. For example, the RF input voltage V$_{RFIN}$ includes a forward voltage component V$_F$ and a reverse voltage component V$_R$, or:

$$V_{RFIN} = V_F + V_R.$$  EQ. 1:

The RF input current I$_{RFIN}$ includes a forward current component I$_F$ and a reverse current component I$_R$, or:

$$I_{RFIN} = I_F - I_R.$$  EQ. 2:

If the input impedance to the phase-shift circuit 42 is large compared with resistance of the first resistive element R1, then the first capacitive element C1 and the first resistive element R1 form a complex voltage divider, or:

$$V_1 = V_{RFIN}(R1)/[R1 + 1/j\omega(C1)].$$  EQ. 3:

If R1<<1/j$\omega$(C1), then EQ. 3 reduces to:

$$V_1 = j\omega(C1)(R1)V_{RFIN} = [\omega(C1)(R1)V_{RFIN}] \angle -90°.$$  EQ. 4:

If the input impedance Z$_I$=1/K$\angle$−θ, and the phase-shift circuit 42 provides an output that is equal to its input times 1$\angle$−θ, then:

$$V_{VDET} = (V_1)(1\angle -\theta).$$  EQ. 5:

Substituting EQ. 4 into EQ. 5:

$$V_{VDET} = [(\omega(C1)(R1)V_{RFIN}\angle -90°](1\angle -\theta).$$  EQ. 6:

Which reduces to:

$$V_{VDET} = (\omega(C1)(R1)V_{RFIN})\angle -(\theta + 90°).$$  EQ. 7:

Substituting EQ. 1 into EQ. 7:

$$V_{VDET} = [\omega(C1)(R1)(V_F + V_R)] \angle -(\theta + 90°).$$  EQ. 8:

Which multiplies out to:

$$V_{VDET} = [\omega(C1)(R1)(V_F) \angle -(\theta + 90°)] + [\omega(C1)(R1)(V_R) \angle -(\theta + 90°)].$$  EQ. 9:

Switching to the current detection circuitry 28:

$$V_{IDET} = (j\omega M)I_{RFIN} = [\omega(M)I_{RFIN}] \angle -90°.$$  EQ. 10:

Substituting EQ. 2 into EQ. 10:

$$V_{IDET} = (\omega M)(I_F - I_R) \angle -90°.$$  EQ. 11:

Since I$_F$=V$_F$/Z$_I$, and since I$_R$=V$_R$/Z$_I$, then:

$$V_{IDET} = (\omega M)(V_F/Z_I - V_R/Z_I) \angle -90°.$$  EQ. 12:

Substituting for Z$_I$:

$$V_{IDET} = (\omega M)[(KV_F \angle -\theta) - (KV_R \angle -\theta)] \angle -90°.$$  EQ. 13:

Which reduces to:

$$V_{IDET} = [\omega MK(V_F) \angle -(\theta + 90°)] + [\omega MK(V_R) \angle -(\theta + 90°)].$$  EQ. 14:

Switching to the output of the combining circuitry 32:

$$V_{PDET} = V_{VDET} + V_{IDET}.$$  EQ. 15:

Substituting EQ. 9 and EQ. 14 into EQ. 15:

$$V_{PDET} = [\omega(C1)(R1)(V_F) \angle -(\theta + 90°)] + [\omega(C1)(R1)(V_R) \angle -(\theta + 90°)] + [\omega MK(V_F) \angle -(\theta + 90°)] + [\omega MK(V_R) \angle -(\theta + 90°)].$$  EQ. 16:

If (C1)(R1)=MK, then substituting into EQ. 16:

$$V_{PDET} = [\omega(C1)(R1)(V_F) \angle -(\theta + 90°)] + [\omega(C1)(R1)(V_R) \angle -(\theta + 90°)] + [\omega(C1)(R1)(V_F) \angle -(\theta + 90°)] + [\omega(C1)(R1)(V_R) \angle -(\theta + 90°)].$$  EQ. 17:

Note that the forward components add and the reverse components cancel so that EQ. 17 reduces to:

$$V_{PDET} = [2\omega(C1)(R1)(V_F) \angle -(\theta + 90°)].$$  EQ. 18:

It is worth noting that if the phase-shift presented by the input impedance Z$_I$ is zero, then θ=0, and the phase-shift circuit 42 is not needed.

Figure 10:
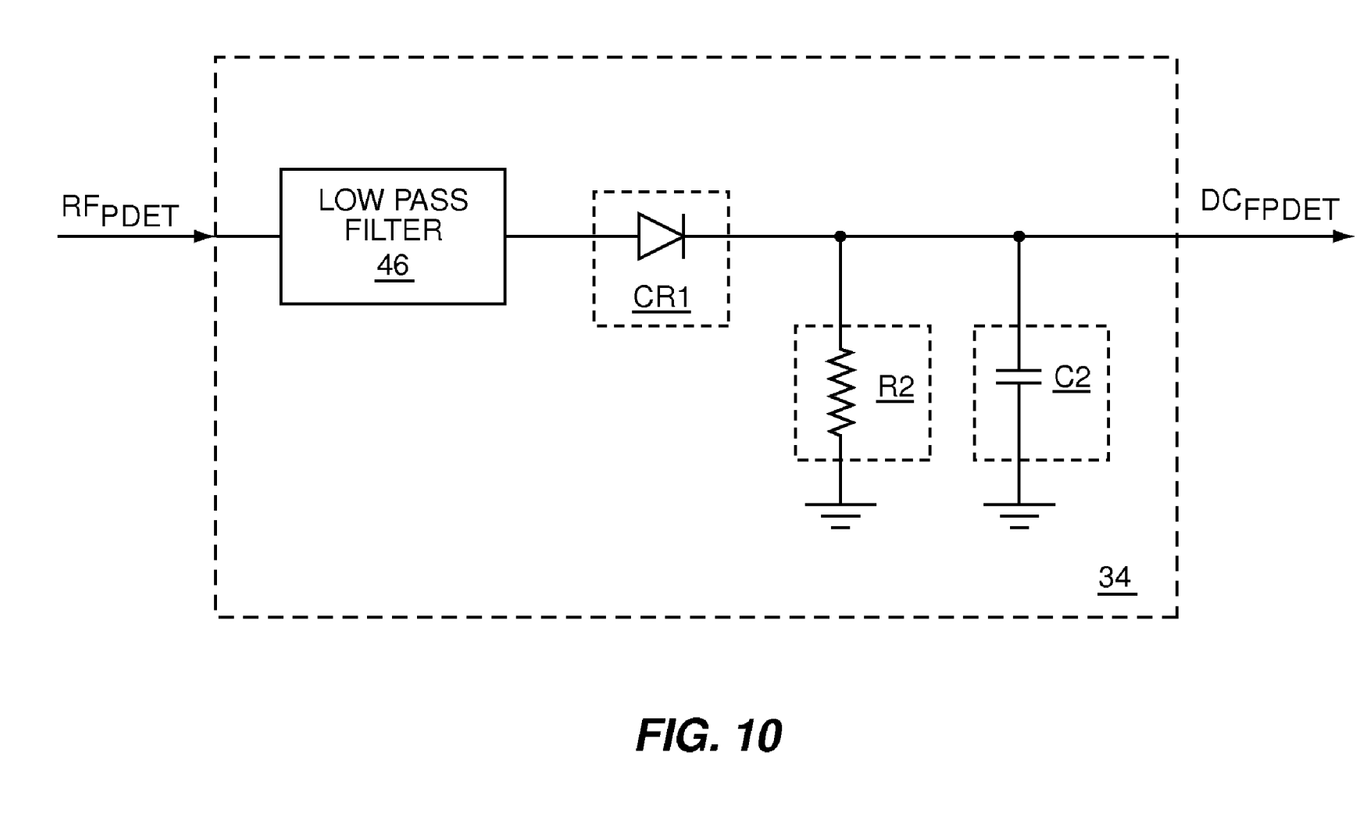
FIG. 10 shows details of the RF detection circuitry illustrated in FIG. 3.

FIG. 10 shows details of the RF detection circuitry 34 illustrated in FIG. 3. The RF power detection signal RF$_{PDET}$ feeds a low pass filter 46, which filters out harmonics of the RF power amplifier output signal RF$_{PAOUT}$. The low pass filter 46 is coupled to the anode of a first diode element CR1, which rectifies the filtered RF power detection signal RF$_{PDET}$. A second resistive element R2 and a second capacitive element C2 are coupled between the cathode of the first diode element CR1 and GROUND to detect and filter the rectified filtered RF power detection signal RF$_{PDET}$. The cathode of the first diode element CR1, the second resistive element R2, and the second capacitive element C2 provide the DC forward power detection signal DC$_{FPDET}$.

Figure 11:
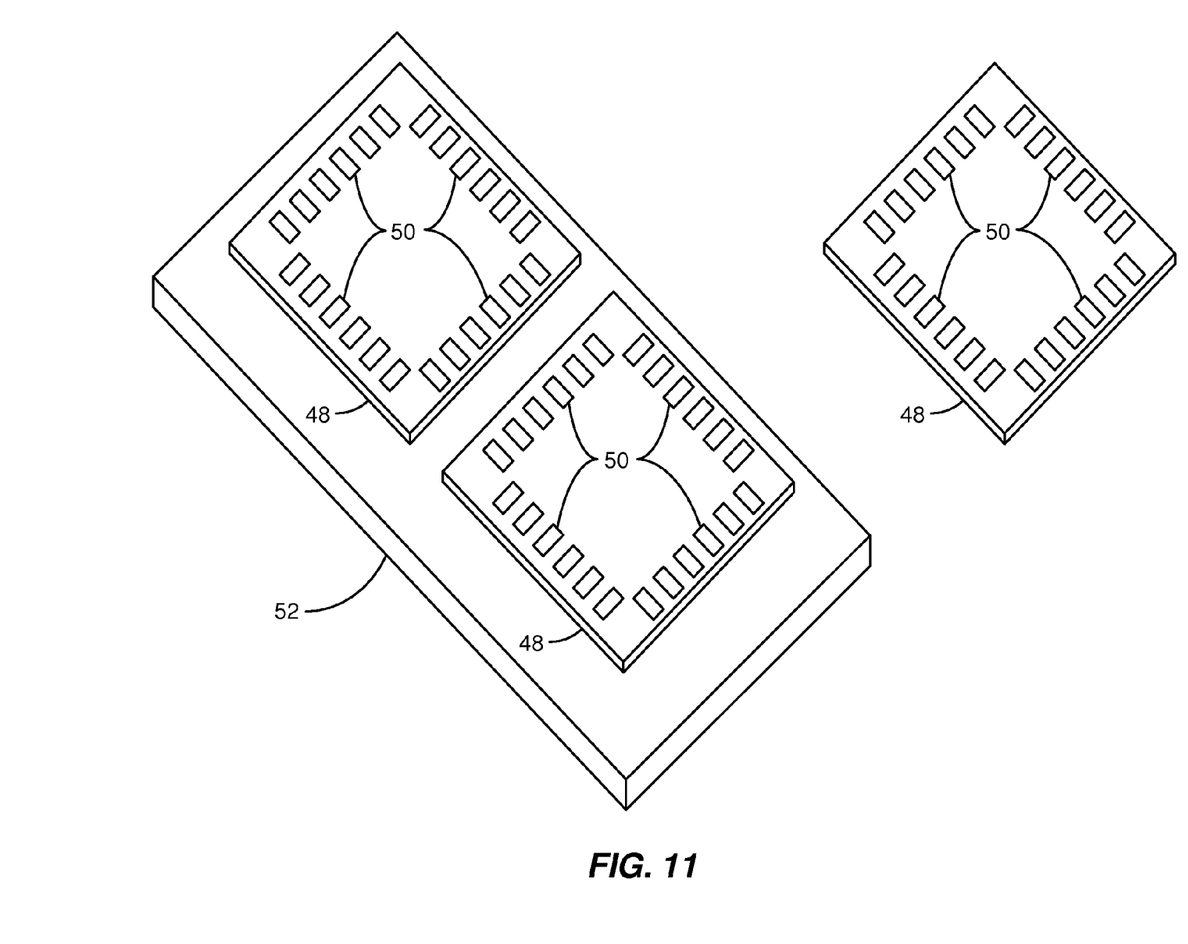
FIG. 11 shows the present invention provided by a single semiconductor die or by multiple semiconductor dies.

FIG. 11 shows the present invention provided by a semiconductor die 48, which includes inter-connection pads 50. In one embodiment of the present invention, the power amplifier 14 and the forward RF power detector 10 are provided by the semiconductor die 48. The output transistors of the final stage 18 may be closely coupled to the input IN of the forward RF power detector 10 for optimal measurement of forward power. In an alternate embodiment of the present invention, multiple semiconductor dies 48 may be mounted to a substrate 52. The power amplifier 14 and the forward RF power detector 10 may be provided by any combination of the semiconductor dies 48.

Figure 12:
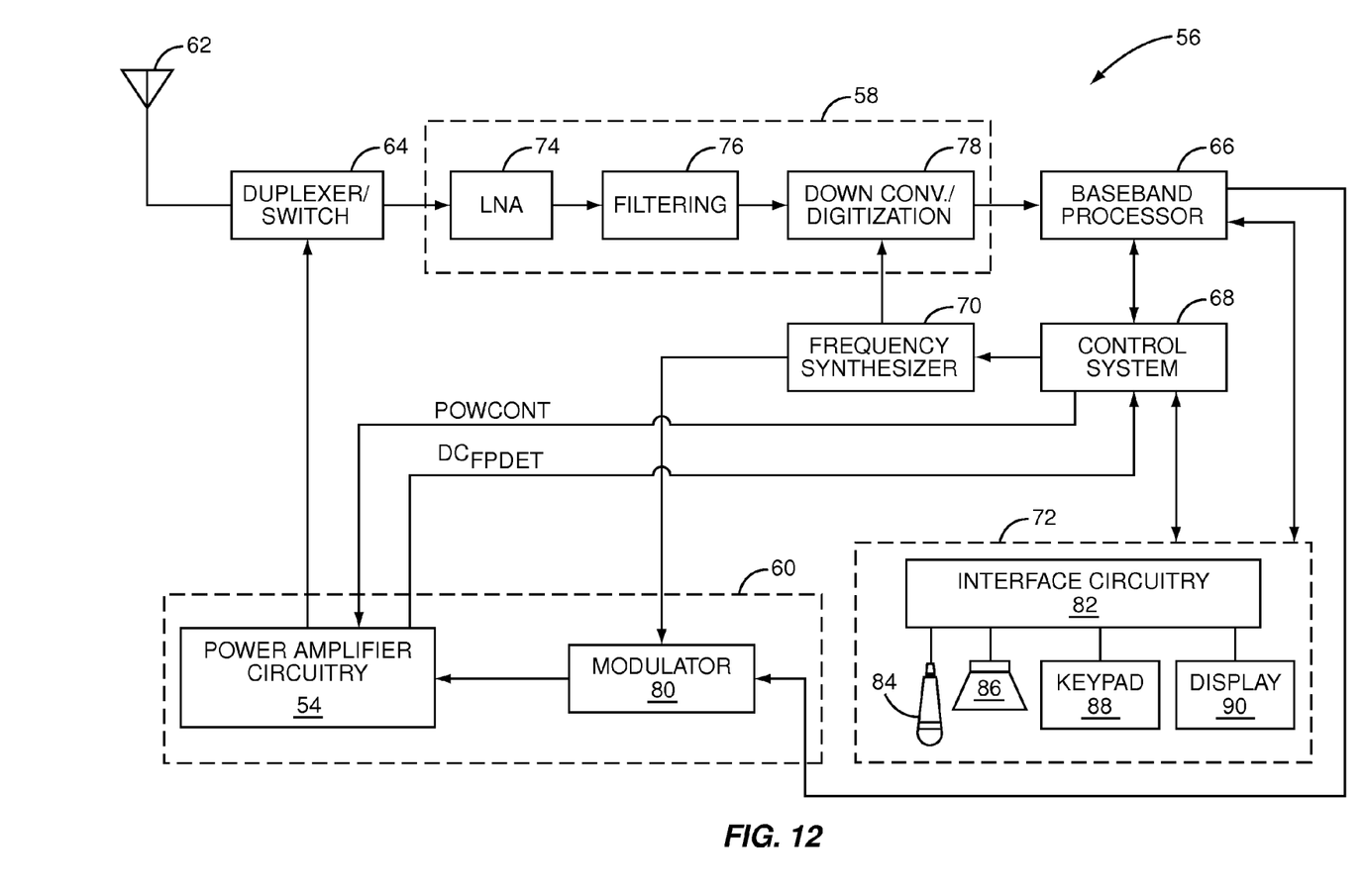
FIG. 12 shows an application example of the present invention used in a mobile terminal.

An application example of a forward RF power detector 10 is its use in power amplifier circuitry 54 in a mobile terminal 56. The basic architecture of the mobile terminal 56 is represented in FIG. 12 and may include a receiver front end 58, a radio frequency transmitter section 60, an antenna 62, a duplexer or switch 64, a baseband processor 66, a control system 68, a frequency synthesizer 70, and an interface 72. The receiver front end 58 receives information bearing radio frequency signals from one or more remote transmitters provided by a base station. A low noise amplifier (LNA) 74 amplifies the signal. A filter circuit 76 minimizes broadband interference in the received signal, while down conversion and digitization circuitry 78 down converts the filtered, received signal to an intermediate or baseband frequency signal, which is then digitized into one or more digital streams. The receiver front end 58 typically uses one or more mixing frequencies generated by the frequency synthesizer 70. The baseband processor 66 processes the digitized received signal to extract the information or data bits conveyed in the received signal. This processing typically comprises demodulation, decoding, and error correction operations. As such, the baseband processor 66 is generally implemented in one or more digital signal processors (DSPs).

On the transmit side, the baseband processor 66 receives digitized data, which may represent voice, data, or control information, from the control system 68, which it encodes for transmission. The encoded data is output to the transmitter 60, where it is used by a modulator 80 to modulate a carrier signal that is at a desired transmit frequency. The power amplifier circuitry 54 amplifies the modulated carrier signal to a level appropriate for transmission, and delivers the amplified and modulated carrier signal to the antenna 62 through the duplexer or switch 64. The forward RF power detector 10 measures the forward power delivered to the antenna 62, and then provides the forward power information in the DC forward power detection signal $DC_{FPDET}$, which is fed to the control system 68. The control system 68 generates the appropriate power control information based on the DC forward power detection signal $DC_{FPDET}$, and then provides the power control information in the power control signal POWCONT, which is fed to the power amplifier circuitry 54. The power amplifier circuitry 54 adjusts its output power based on the power control signal POWCONT.

A user may interact with the mobile terminal 56 via the interface 72, which may include interface circuitry 82 associated with a microphone 84, a speaker 86, a keypad 88, and a display 90. The interface circuitry 82 typically includes analog-to-digital converters, digital-to-analog converters, amplifiers, and the like. Additionally, it may include a voice encoder/decoder, in which case it may communicate directly with the baseband processor 66. The microphone 84 will typically convert audio input, such as the user's voice, into an electrical signal, which is then digitized and passed directly or indirectly to the baseband processor 66. Audio information encoded in the received signal is recovered by the baseband processor 66, and converted by the interface circuitry 82 into an analog signal suitable for driving the speaker 86. The keypad 88 and display 90 enable the user to interact with the mobile terminal 56, input numbers to be dialed, access address book information, or the like, as well as monitor call progress information.

Those skilled in the art will recognize improvements and modifications to the preferred embodiments of the present invention. All such improvements and modifications are considered within the scope of the concepts disclosed herein and the claims that follow.

What is claimed is:

1. Radio frequency (RF) circuitry that measures RF power in a first direction through RF power detection circuitry, the RF power detection circuitry comprising:
   current detection circuitry that:
   receives and measures the RF current; and
   utilizes the measured RF current to provide a first RF detection signal, wherein the first RF detection signal outputted by the current detection circuitry has a first phase shift applied by the current detection circuitry, such that the phase of the first RF detection signal differs from that of the RF current, wherein the RF detection signal has a first component that is representative of a component of the RF current in the first direction and a second component that is representative of a component of the RF current in a direction that is opposite to the first direction;
   voltage detection circuitry that:
   utilizes at least one of an RF input voltage and an RF output voltage to provide a second RF detection signal wherein the second RF detection signal outputted by the voltage detection circuitry has a second phase shift applied by the voltage detection circuitry, such that the phase of the second RF detection signal differs from that of the at least one of an RF input voltage and an RF output voltage, and wherein the second RF detection signal has a first component that is representative of a component of the RF voltage in the first direction and a second component that is representative of a component of the RF voltage in the direction that is opposite to the first direction; and
   combining circuitry that: provides a directional RF power detection signal, which is representative of the RF power in the first direction by summing the first and second RF detection signals, such that the second component of the first RF detection signal and the second component of the second RF detection signal substantially cancel one another.

2. The RF circuitry of claim 1 wherein the first direction is a forward direction, the first component of the first RF detection signal is a forward component, the first component of the second RF detection signal is a forward component, the second component of the first RF detection signal is a reverse component, the second component of the second RF detection signal is a reverse component, and the directional RF power detection signal is representative of forward RF power.

3. The RF circuitry of claim 1 wherein the first direction is a reverse direction, the first component of the first RF detection signal is a reverse component, the first component of the second RF detection signal is a reverse component, the second component of the first RF detection signal is a forward component, the second component of the second RF detection signal is a forward component, and the directional RF power detection signal is representative of reverse RF power.

4. The RF circuitry of claim 1 wherein the first phase-shift is approximately 90 degrees.

5. The RF circuitry of claim 1 further comprising a complex RF load adapted to receive the RF voltage and RF current, wherein the complex RF load presents an impedance having a load magnitude and a load phase such that at least one of the first and second phase-shifts is a function of the load phase.

6. The RF circuitry of claim 5 wherein the second phase-shift is a function of the first phase-shift and the load phase.

7. The RF circuitry of claim 5 wherein the complex RF load comprises impedance translating circuitry.

8. The RF circuitry of claim 7 further comprising an RF amplifier having an RF amplifier output such that the current detection circuitry is coupled between the RF amplifier output and the impedance translating circuitry, and the voltage detection circuitry is coupled to one of the RF amplifier output and the impedance translating circuitry.

9. The RF circuitry of claim 5 wherein the load phase is approximately equal to zero degrees.

10. The RF circuitry of claim 5 wherein the load phase is not equal to zero degrees.

11. The RF circuitry of claim 5 wherein one of the current detection circuitry and the voltage detection circuitry comprises compensation phase-shift circuitry adapted to provide a compensating phase-shift approximately equal to the load phase.

12. The RF circuitry of claim 1 wherein the combining the first and second RF detection signals further comprises summing the first and second RF detection signals.

13. The RF circuitry of claim 1 wherein the combining the first and second RF detection signals further comprises subtracting the first and second RF detection signals.

14. The RF circuitry of claim 1 further comprising RF to direct current (DC) conversion circuitry adapted to receive the directional RF power detection signal and adapted to provide a directional DC power detection signal as a function of an amplitude of the directional RF power detection signal.

15. The RF circuitry of claim 1 wherein the current detection circuitry comprises a first inductive element magnetically coupled to a second inductive element such that:
  the first and second inductive elements have a mutual inductance;
  the first inductive element is adapted to receive the RF input current and provide the RF output current; and
  the second inductive element is adapted to provide the first RF detection signal.

16. The RF circuitry of claim 1 further comprising an RF amplifier having an RF amplifier output such that the current detection circuitry and the voltage detection circuitry are coupled to the RF amplifier output.

17. The RF circuitry of claim 16 wherein the RF amplifier, the current detection circuitry, and the voltage detection circuitry are provided by a single semiconductor die.

18. The RF circuitry of claim 16 wherein the RF amplifier, the current detection circuitry, and the voltage detection circuitry are provided by at least two semiconductor dies mounted to a common substrate.

19. The RF circuitry of claim 1 further comprising an RF transmitter having a transmitter output power wherein the directional RF power detection signal is a function of the transmitter output power.

20. The RF circuitry of claim 19 wherein the transmitter output power is adjusted based on the directional RF power detection signal.

21. A method for measuring RF power in a first direction through RF power detection circuitry, comprising:
  utilizing a measurement of an RF current to provide a first RF detection signal, wherein the first RF detection signal derived from the RF current measurement has a first phase shift applied by the RF current measurement circuitry, such that the phase of the first RF detection signal differs from that of the RF current, and wherein the first RF detection signal has a first component that is representative of a component of the RF current in the first direction and a second component of the RF current that is representative of the RF current in a direction that is opposite to the first direction;
  utilizing a measurement of an RF voltage to provide a second RF detection signal wherein the second RF detection signal outputted by the RF voltage measurement circuitry has a second phase shift applied by the RF voltage measurement circuitry, such that the phase of the second RF detection signal differs from that of the RF voltage, and wherein the second RF detection signal has a first component that is representative of a component of the RF voltage in the first direction and a second component of the RF current that is representative of the RF voltage in a direction that is opposite to the first direction; and
  summing the first and second RF detection signals to provide a directional RF power detection signal, which is representative of the RF power in the first direction, such that the second component of the first RF detection signal and the second component of the second RF detection signal substantially cancel one other.

22. The RF circuitry of claim 1 wherein the RF current is an RF input current.

23. The RF circuitry of claim 1 wherein the RF current is an RF output current.

24. The RF circuitry of claim 1 wherein the RF voltage is an RF input voltage.

25. The RF circuitry of claim 1 wherein the RF voltage is an RF output voltage.

* * * * *